(12) United States Patent
Albers et al.

(10) Patent No.: US 10,672,731 B2
(45) Date of Patent: Jun. 2, 2020

(54) WAFER LEVEL PACKAGE STRUCTURE WITH INTERNAL CONDUCTIVE LAYER

(71) Applicant: Intel IP Corporation, Santa Clara, CA (US)

(72) Inventors: Sven Albers, Regensburg (DE); Klaus Reingruber, Langquaid (DE); Georg Seidemann, Landshut (DE); Christian Geissler, Teugn (DE); Richard Patten, Langquaid (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/776,051

(22) PCT Filed: Dec. 23, 2015

(86) PCT No.: PCT/EP2015/081133
§ 371 (c)(1),
(2) Date: May 14, 2018

(87) PCT Pub. No.: WO2017/108122
PCT Pub. Date: Jun. 29, 2017

(65) Prior Publication Data
US 2018/0358317 A1   Dec. 13, 2018

(51) Int. Cl.
*H01L 23/552* (2006.01)
*H01L 23/00* (2006.01)
(Continued)

(52) U.S. Cl.
CPC .......... *H01L 24/24* (2013.01); *H01L 21/4857* (2013.01); *H01L 21/561* (2013.01); *H01L 21/568* (2013.01); *H01L 23/3128* (2013.01); *H01L 23/36* (2013.01); *H01L 23/4334* (2013.01); *H01L 23/49822* (2013.01); *H01L 23/552* (2013.01); *H01L 24/82* (2013.01); *H01L 24/96* (2013.01); *H01L 24/97* (2013.01); *H01L 2224/24225* (2013.01); *H01L 2224/24226* (2013.01); *H01L 2224/82005* (2013.01); *H01L 2224/9222* (2013.01); *H01L 2224/97* (2013.01);
(Continued)

(58) Field of Classification Search
USPC ......................................................... 257/659
See application file for complete search history.

(56) References Cited

U.S. PATENT DOCUMENTS 7,618,846 B1 * 11/2009 Pagaila ................. H01L 21/568
257/E21.599
2008/0315375 A1   12/2008 Eichelberger et al.
(Continued)

FOREIGN PATENT DOCUMENTS

EP          2824705 A2     1/2015

OTHER PUBLICATIONS

International Search Report and Written Opinion for International Patent Application No. PCT/EP2015/081133 dated Mar. 10, 2016, 2016, 14 pgs.

*Primary Examiner* — Niki H Nguyen
(74) *Attorney, Agent, or Firm* — Schwabe, Williamson & Wyatt, P.C.

(57) ABSTRACT

An apparatus is described that includes a redistribution layer and a semiconductor die on the redistribution layer. An electrically conductive layer resides over the semiconductor die. A compound mold resides over the electrically conductive layer.

18 Claims, 15 Drawing Sheets

(51) Int. Cl.
*H01L 23/433* (2006.01)
*H01L 21/56* (2006.01)
*H01L 21/48* (2006.01)
*H01L 23/31* (2006.01)
*H01L 23/36* (2006.01)
*H01L 23/498* (2006.01)

(52) U.S. Cl.
CPC ............... *H01L 2924/15311* (2013.01); *H01L 2924/3025* (2013.01)

(56) References Cited

U.S. PATENT DOCUMENTS

| | | | |
|---|---|---|---|
| 2011/0241218 A1* | 10/2011 | Meyer | H01L 25/16 257/774 |
| 2012/0139097 A1 | 6/2012 | Jin et al. | |
| 2012/0286240 A1 | 11/2012 | Yu et al. | |
| 2013/0105982 A1 | 5/2013 | Jin et al. | |
| 2013/0292808 A1* | 11/2013 | Yen | H01L 23/552 257/660 |
| 2013/0307128 A1 | 11/2013 | Lin et al. | |
| 2014/0015116 A1 | 1/2014 | Fu et al. | |
| 2015/0108661 A1* | 4/2015 | Vincent | H01L 24/30 257/777 |
| 2015/0348936 A1* | 12/2015 | Lin | H01L 23/552 257/659 |
| 2016/0276307 A1* | 9/2016 | Lin | H01L 21/561 |
| 2017/0125375 A1* | 5/2017 | Chinnusamy | H01L 21/565 |

\* cited by examiner

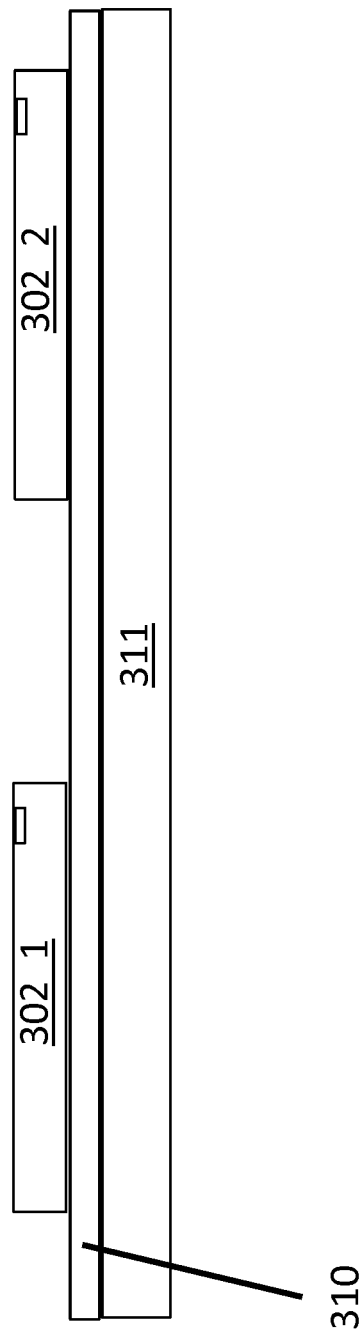

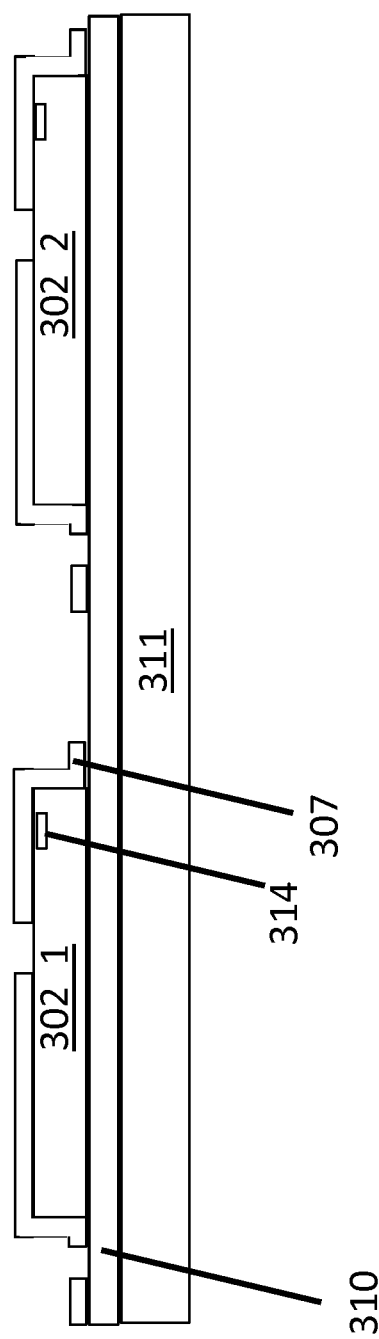

WAFER LEVEL PACKAGE STRUCTURE WITH INTERNAL CONDUCTIVE LAYER

CROSS-REFERENCE TO RELATED APPLICATION

This patent application is a U.S. National Phase Application under 35 U.S.C. § 371 of International Application No. PCT/EP2015/081133, filed Dec. 23, 2015, entitled "WAFER LEVEL PACKAGE STRUCTURE WITH INTERNAL CONDUCTIVE LAYER," which designates the United States of America, the entire disclosure of which is hereby incorporated by reference in its entirety and for all purposes.

FIELD OF INVENTION

The field of invention pertains generally to the semiconductor arts, and, more specifically, to a wafer level package structure with internal conductive layer.

BACKGROUND

The semiconductor arts has traditionally faced the challenge of attempting to integrate electronic functionality into as small a volume as possible. Chip stacking has recently emerged as a popular packaging technology for integrating multiple semiconductor die into a same semiconductor package.

FIGURES

A better understanding of the present invention can be obtained from the following detailed description in conjunction with the following drawings, in which.

Figure 2:
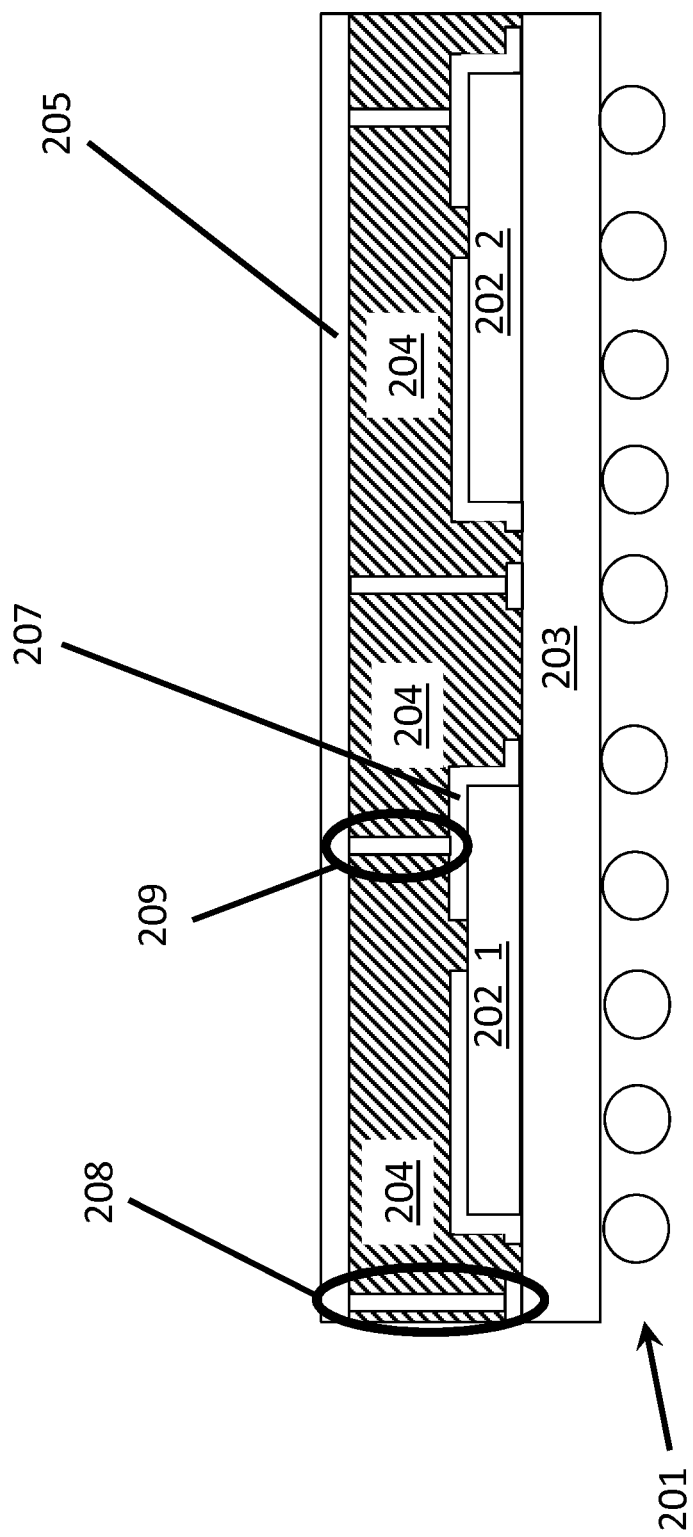
FIG. 2 shows an improved wafer level packaging structure.
Figure 3B:
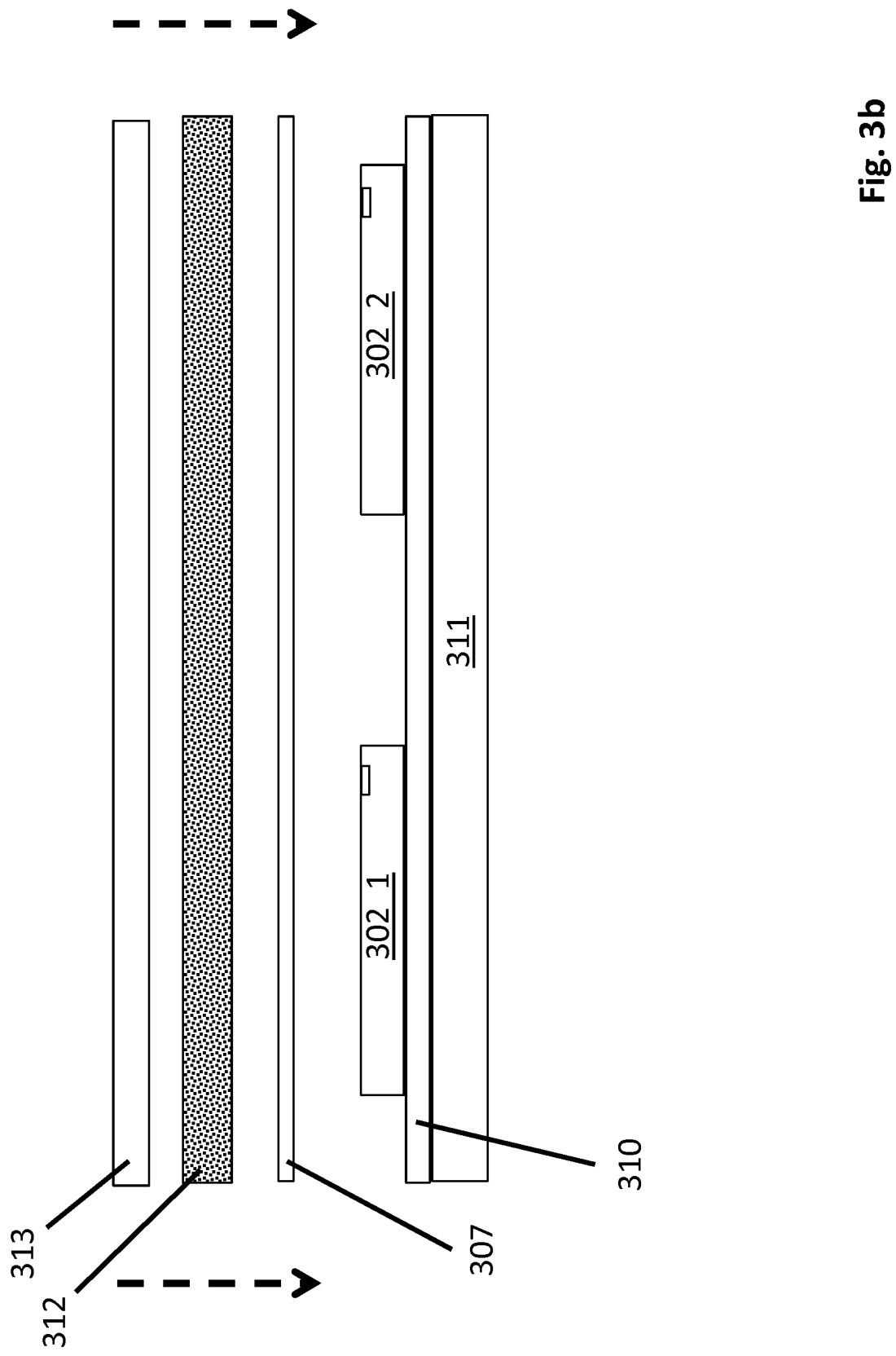
Figure 3C:
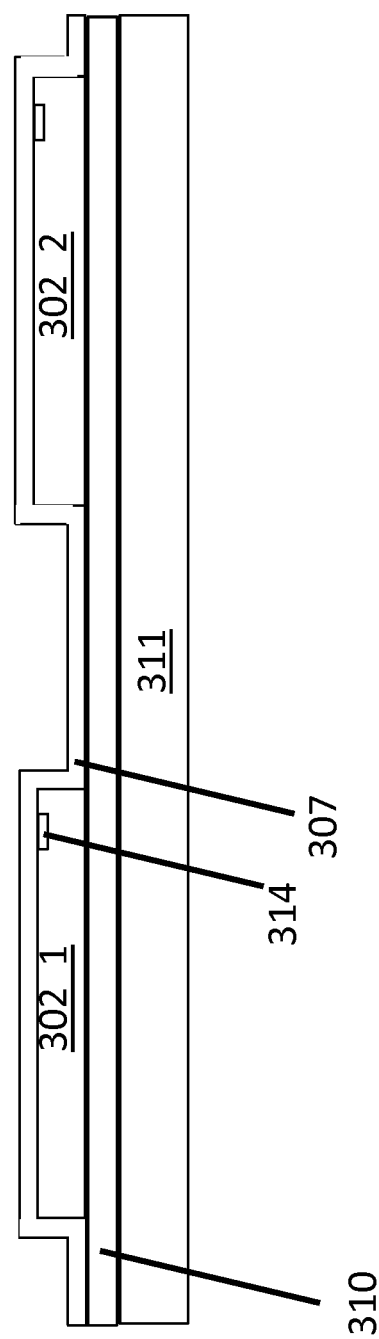
Figure 3E:
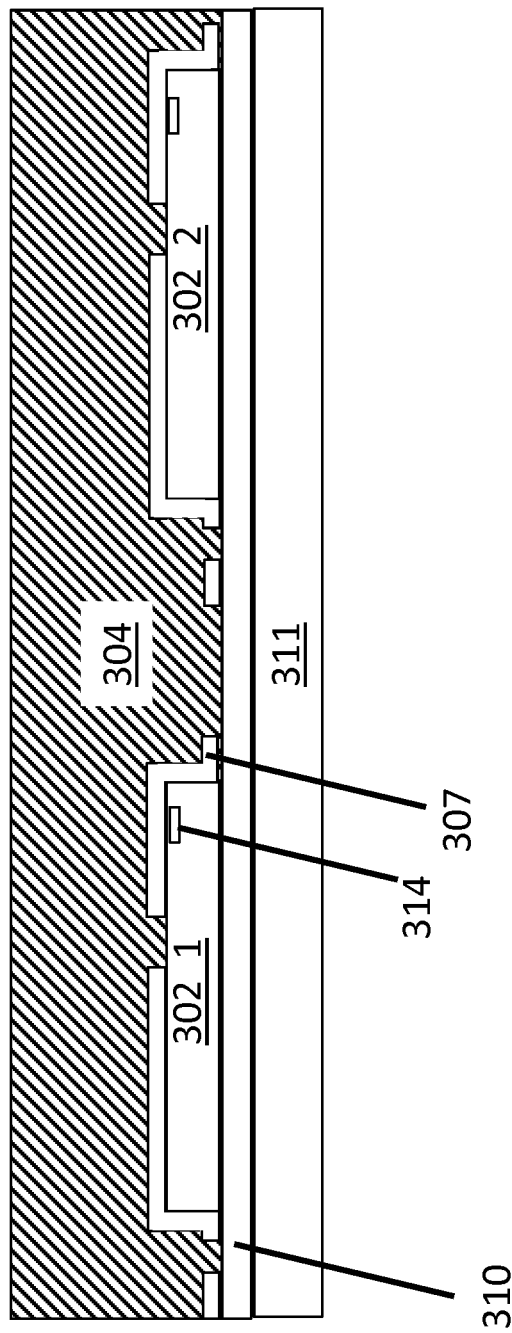
Figure 3F:
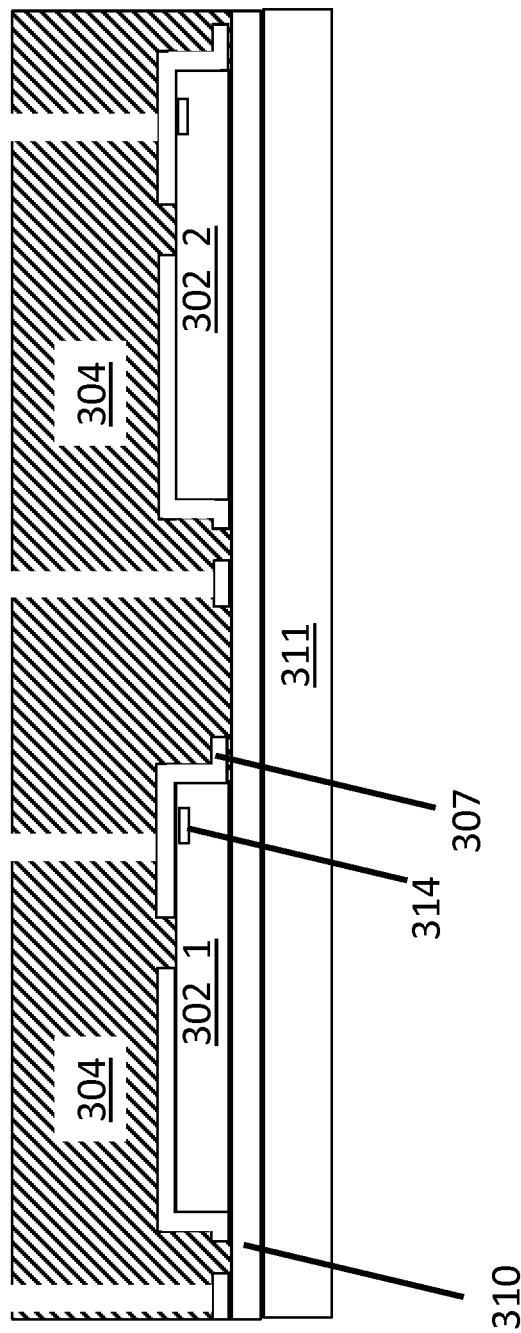
Figure 3G:
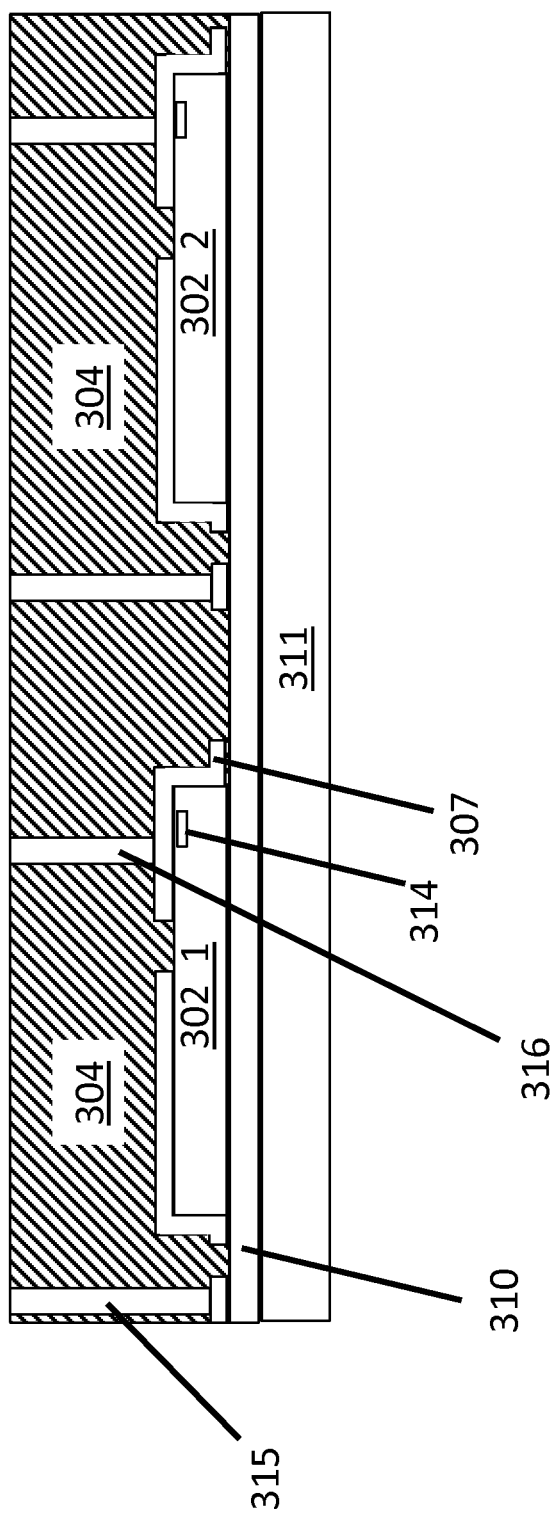
Figure 3H:
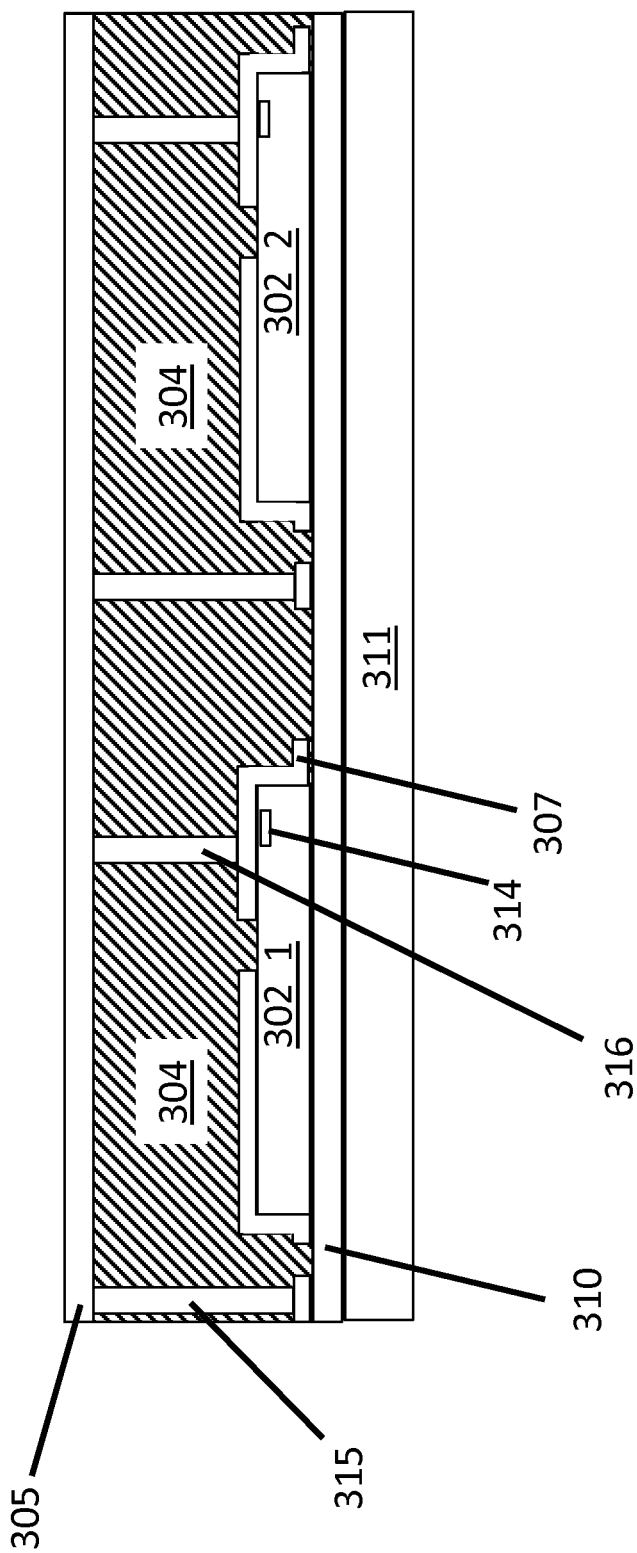
Figure 3I:
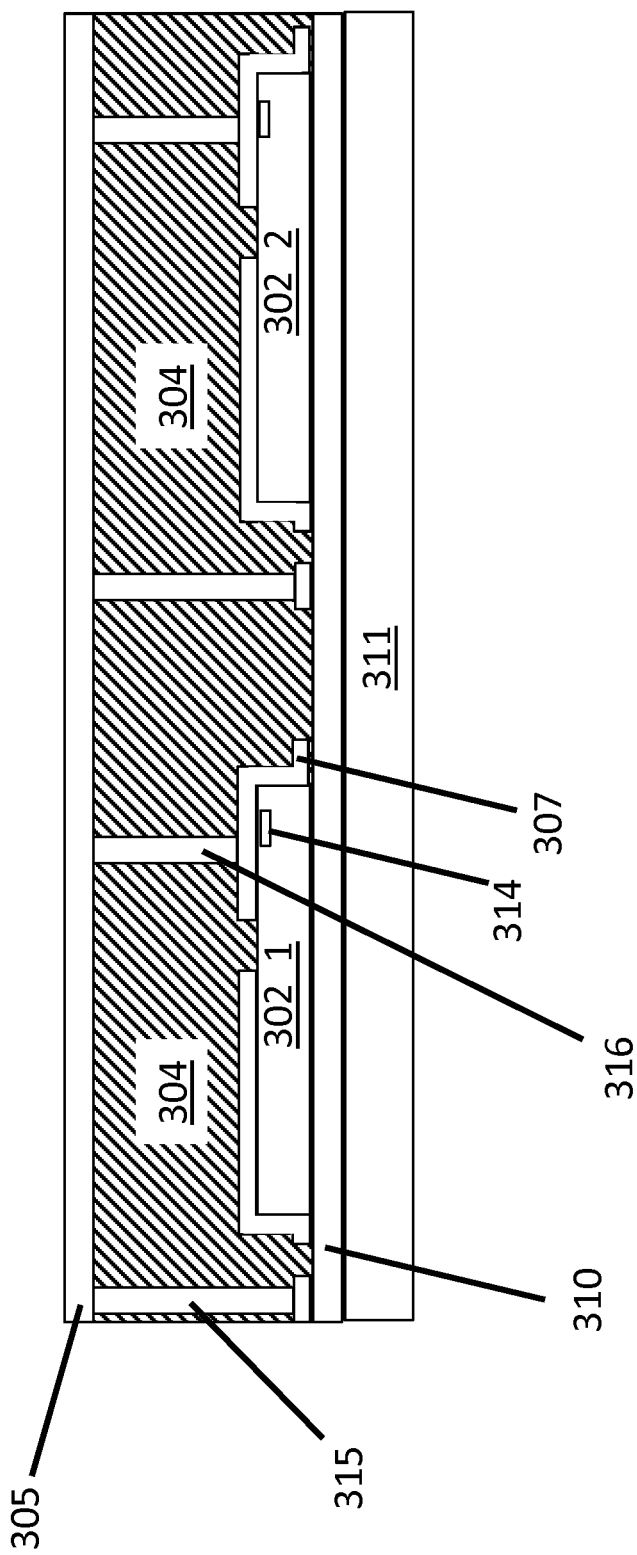
Figure 3J:
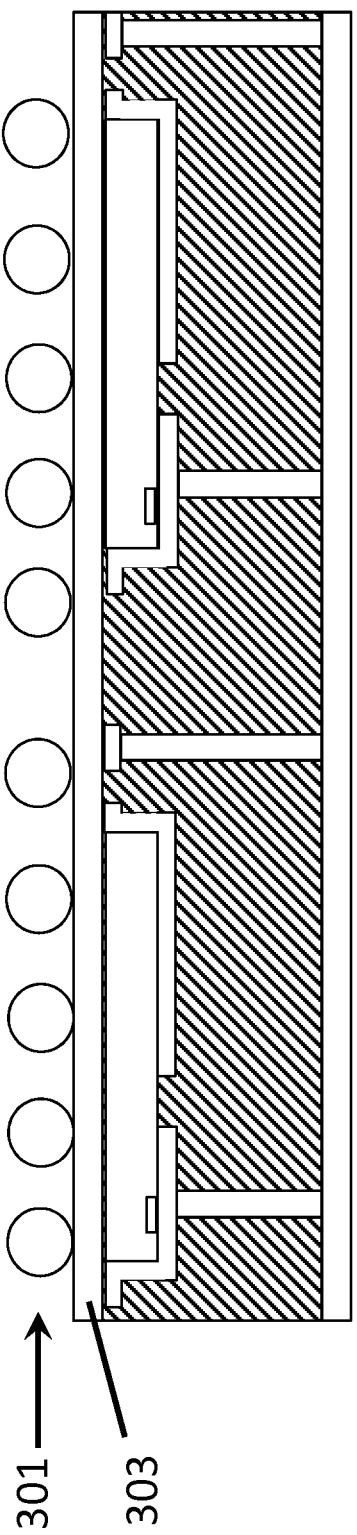
Figure 3K:
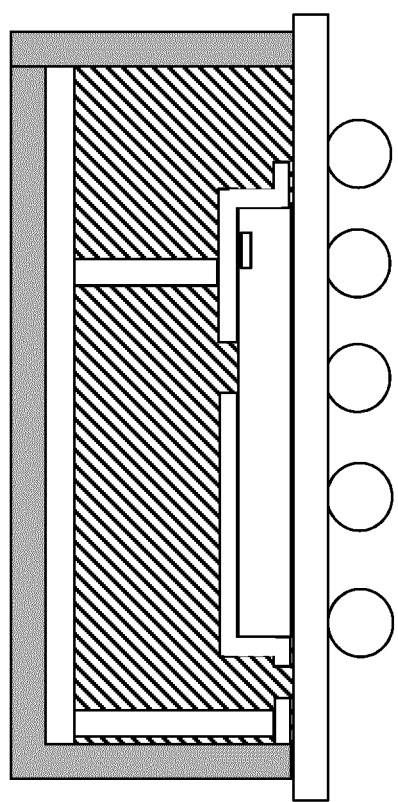
Figure 4:
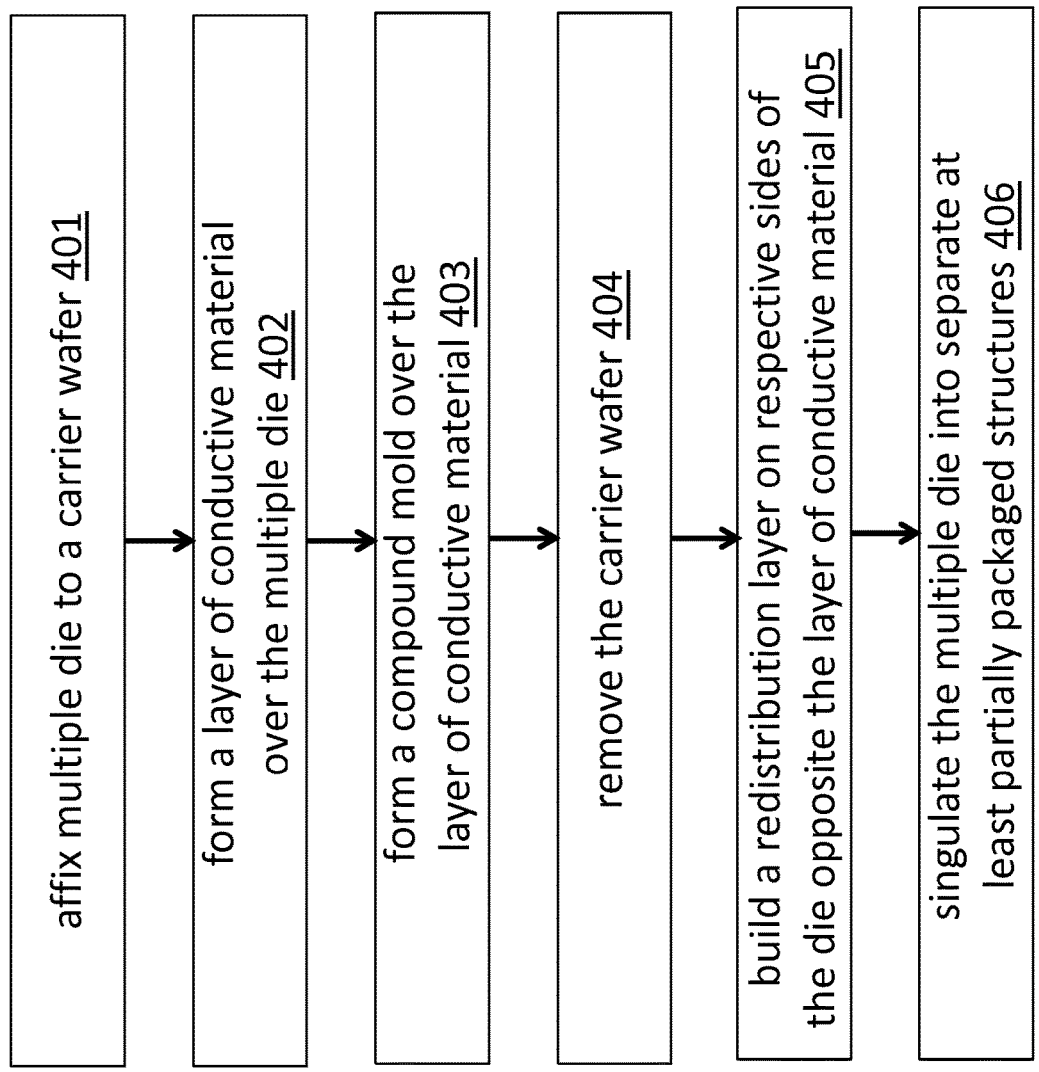
Figure 5:
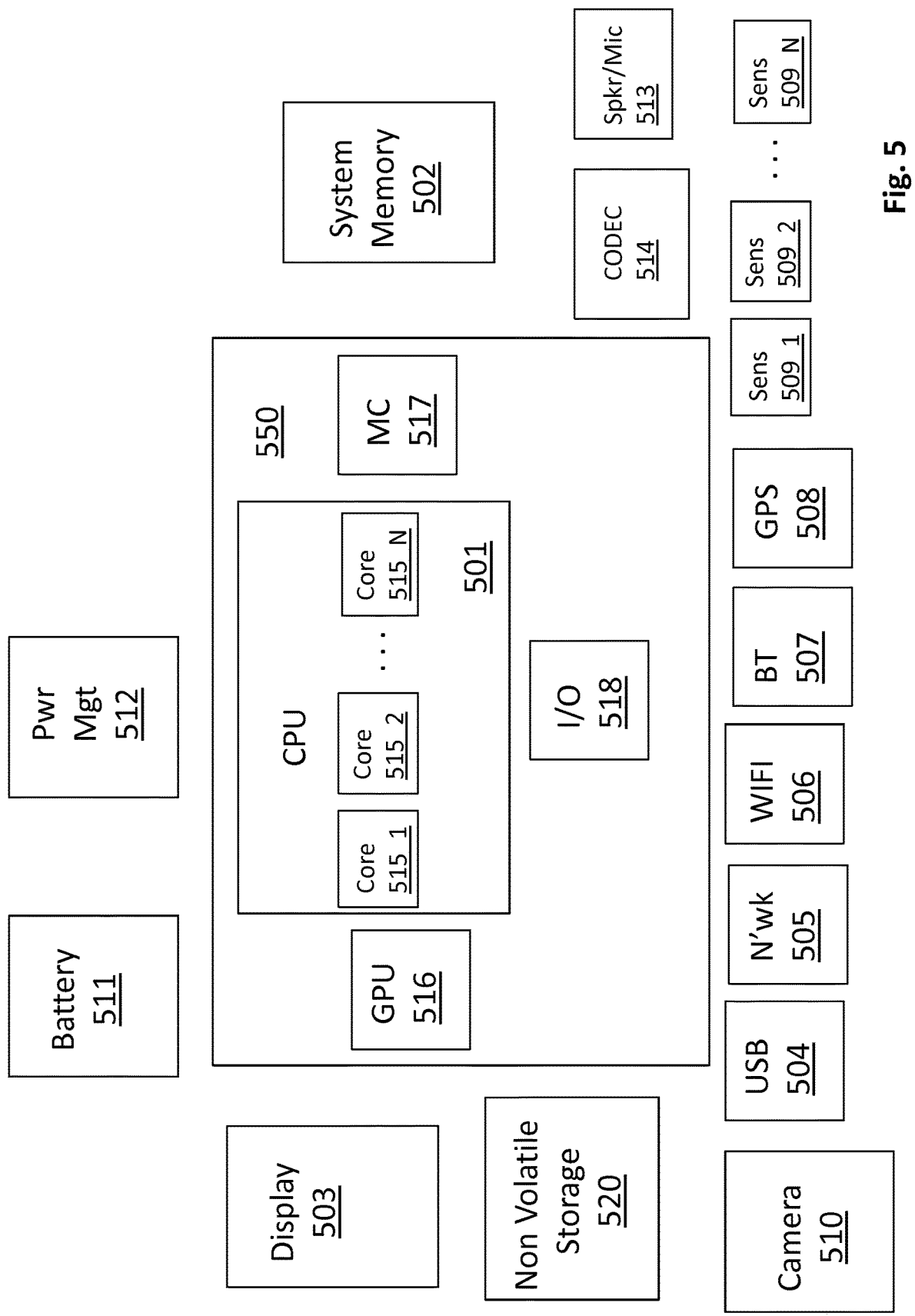

FIGS. 3*a* through 3*k* show a method of manufacturing for the wafer level packaging structure of FIG. 2;

FIG. 4 shows a method of the manufacturing process of FIGS. 3*a* through 3*k*;

FIG. 5 shows a computing system.

DETAILED DESCRIPTION

Wafer level packaging technology parallelizes the packaging process while, at the same time, allows for higher package I/O densities. Whereas traditional packaging technology dices individual semiconductor die from a wafer and packages them individually, by contrast, wafer level packaging performs much of the overall packaging (including I/Os in at least some approaches) as a wafer level process so that multiple die simultaneously receive their corresponding surrounding packaging structures.

The wafer itself is many cases is an artificial wafer and not the semiconductor wafer that the multiple die are fabricated from (i.e., similar to traditional approaches, the individual die are singulated before the wafer level process begins). Additionally, more than one artificial wafer may be realized during the wafer level packaging process. When the final artificial wafer is singulated after the wafer level packaging processes are complete, each of the resulting structures is an individual semiconductor die with completed or nearly completed surrounding packaging layers (e.g., all packaging and I/O structures are formed except for the lid).

Figure 1:
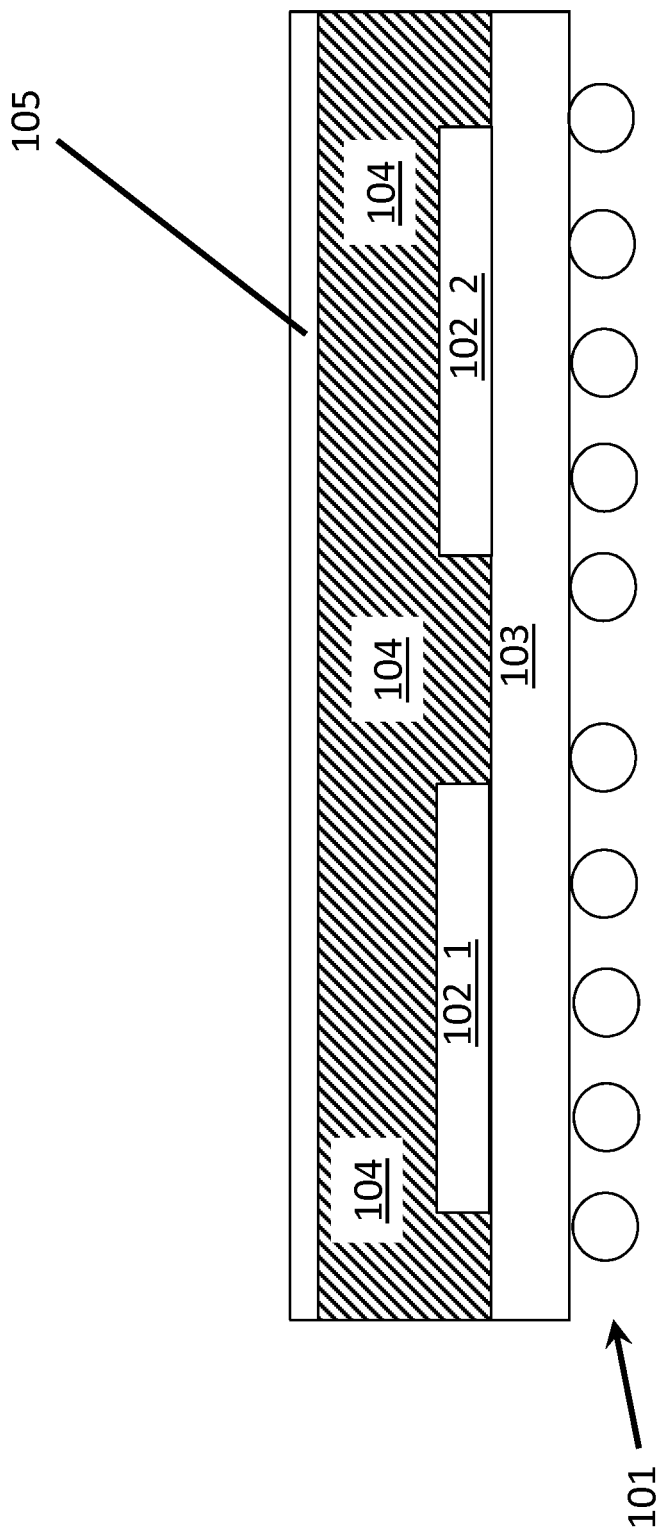
FIG. 1 shows a prior art wafer level packaging structure.

FIG. 1 shows a traditional wafer level packaging structure just prior to singulation. As observed in FIG. 1, an artificial wafer containing multiple die 102_1, 102_2 has a redistribution layer 103 formed on the wafer's underside. The redistribution layer 103 includes patterned alternating metallization and dielectric layers to form the electronic traces that couple I/O pads on the underside of the die 102_1, 102_2 to solder balls 101 formed on the underside of the redistribution layer 103. In other implementations, a land grid array having pad I/Os, rather than a ball grid array as depicted in FIG. 1 may be present on the underside of the redistribution layer 103.

A compound mold 104 is formed over the die 102_1, 102_2. Backside metallization may also be formed on the topside of the compound mold 104 to implement various structures that increase the performance of the package. For instance, as depicted in FIG. 1, the layer of metal 105 on the top side of the compound mold 104 may be used to implement, e.g., a heat spreader structure that acts to uniformly spread the heat generated by the semiconductor die across a larger surface area to enable more efficient removal of heat from the structure, or, the layer of metal may be used to form a shield to isolate the die 102_1, 102_2 from external electro-magnetic interference (EMI) noise. After the wafer like structure of FIG. 1 is diced into individual singulated structures, a lid may be attached to each structure to hermetically seal it.

A problem with the structure of FIG. 1 is the absence of any metal layer above the top of the die 102_1, 102_2 and beneath the metallization layer 105. That is, although in prior art approaches a metallization layer 105 may be placed on the top surface of the compound mold 104, no metallization is observed, e.g., "within" the compound mold 104. If any such metallization layer did exist it could be beneficially used as any one or more of a wiring layer, a voltage plane, an EMI shield and a heat spreader.

FIG. 2 shows an improved structure that includes such an internal metallization layer 207. Here, as observed in FIG. 2, the internal metallization layer 207 is used not only to form a pad that supports a first electrical connection 208 between the redistribution layer 203 and the top side metallization 205, but also, is used to support a second electrical connection 209 between the semiconductor die 202 and the top side metallization 205.

As observed in FIG. 2, the internal metallization layer 207 is patterned so that it can be formed to help implement various electrical structures. Examples include, to name a few, any of: 1) a shield layer that sits directly over the die; 2) a heat spreader that sits directly over the die; 3) an extra wiring layer that sits directly over the redistribution layer and/or die; 4) die contact pad; 5) redistribution layer contact pad; 6) a local voltage or ground reference plane for the die and/or the redistribution layer, etc. Additionally, through mold vias can be formed within the compound mold 204 to electrically couple the internal metallization layer 207 to the top side metallization 205.

Note that at least in the case of a heat spreader and a shield, the performance of both of these roles as performed by the internal metallization layer 207 should be an improvement over the top side metallization 205 because of the closer proximity of the internal metallization layer 207 to the die 202 than the top side metallization 205. That is, in the case of a heat spreader, there is less thermal resistance between the die 202 and the internal metallization layer 207 than between the die 202 and the top side metallization 205 because the internal metallization layer 207 is closer to the die 202 than the top side metallization layer 205.

For similar reasons the internal metallization layer 207 may also act as a better shield than the top side metallization

205. Thus, apart from introducing another wiring and/or contact layer so as to improve internal signal densities, the internal metallization layer 207 may also increase heat spreading and/or shielding performance which, in turn, may permit higher performance by the die 202 itself.

FIGS. 3a through 3j show an exemplary process for manufacturing a wafer level packaging structure with internal metallization as described just above with respect to FIG. 2.

As observed in FIG. 3a multiple semiconductor die 302_1, 302_2 are singulated and placed on an adhesive layer 310, such as adhesive tape, that affixes the die 302_1, 302_2 to a lower carrier wafer 311.

As observed in FIG. 3b, a metal foil 307 (such as a thin sheet of copper) is placed over the structure of FIG. 3a. The metal foil 307 is backed by a compressible and flexible sheet 312 (e.g., rubber or silicone) and steel plate 313. The steel plate is pressed toward the carrier substrate 311 to mold the foil 307 around the topography of the die 302_1, 302_2 so as to effectively form a layer of metal 307 over the die 302_1, 302_2 as observed in FIG. 3c.

In an alternate embodiment, the metallization layer 307 may be deposited on the structure surface by way of a deposition process (e.g., sputter deposition). In this case, the metallization may be formed with materials other than metal such as doped semiconductor material (e.g., N type Si). In yet another embodiment, one or more layers of dielectric material may be disposed on the structure surface before deposition of the internal metallization layer. The dielectric material may also be patterned, before deposition of the internal metallization layer, to expose openings where electrical contact between the metallization layer and the die and/or redistribution layer are to take place. Thus, as the internal metallization is being deposited, the openings are filled with conductive material as well to form the appropriate contacts to the lower structures.

Here, it is worthwhile to note that each die may be mostly insulating on its top side so that the internal metallization foil makes no electrical contact with the much of the upper die surface (e.g., the metallization layer is instead used to support connections to the redistribution layer), and/or, there may exist electrical contact structures on the top surface of the die that make electrical contact to the internal metallization layer. In the present example, both die include a pad like contact structure 314 that makes electrical contact with the internal metallization layer 307. As will be described further below, the metallization layer 307 is subsequently patterned so as to isolate this particular electrical structure from other electrical structures formed from the internal metallization layer 307.

After the internal metallization layer 307 is formed, the structure is coated with photoresist that is subsequently patterned (e.g., with photo-lithographic techniques) to create openings that expose the internal metallization layer 307. The exposed regions of the metallization layer are then etched by, e.g., a reactive etch process (e.g., a chemical etch, a reactive ion etch, etc.) that removes the exposed metal by reacting with it. As observed in FIG. 3d, the removal of the exposed metal essentially patterns the internal metallization layer 307 into the features needed to form the desired structures and/or electrical connections within the package.

As observed in FIG. 3e, after the photoresist is removed, a compound mold 304 is formed over the structure.

As observed in FIG. 3f, the compound mold is etched, e.g., with a laser ablation process, to expose remaining regions of the internal metallization layer 307. Here, the metallization layer 307 acts as a natural etch stop for the laser ablation and prevents any undesired etch into the adhesive tape 310. In a further embodiment, some of the exposed internal metallization regions may be removed (e.g., by a reactive etch) to form an end-to-end through mold via (i.e., an end to end opening through the compound mold). For illustrative ease FIG. 3f does not show any end-to-end through mold vias.

As observed in FIG. 3g, the openings in the compound mold 304 are filled with metal to form contact vias 315, 316 to the internal metallization 307. The resulting structure may then planarized. As observed in FIG. 3g, for each die 302, one of the contact vias 315 will extend to the redistribution layer while another contact via 316 extends to the semiconductor chip.

As observed in FIG. 3h, the top side metallization 305 is deposited on the structure. In the embodiment of FIG. 3h, the top side metallization 305 is not patterned (e.g., it acts as a heat spreader and/or ground shield for both electrical nodes associated with vias 315, 316). In other embodiments the top side metallization 305 may be patterned to form different top side electrical structures (e.g., one that acts as an electrically isolated EMI shield and another that acts as a voltage node).

As observed in FIG. 3i, the carrier wafer 311 is removed and the structure is flipped to form the redistribution layer 303 and I/O balls 301. After the structure of the FIG. 3i is formed the wafer structure is diced to form multiple single die structures that are subsequently packaged as observed in FIG. 3k.

FIG. 4 shows a method of the above described manufactured process. As observed in FIG. 4 the method includes affixing multiple die to a carrier wafer 401. The method also includes forming a layer of conductive material over the multiple die 402. The method also includes forming a compound mold over the layer of conductive material 403. The method also includes removing the carrier wafer 404. The method also includes building a redistribution layer on respective sides of the die opposite the layer of conductive material 405. The method also includes singulating the multiple die into separate at least partially packaged structures 406.

FIG. 5 shows a depiction of an exemplary computing system 500 such as a personal computing system (e.g., desktop or laptop) or a mobile or handheld computing system such as a tablet device or smartphone, or, a larger computing system such as a server computing system. The computing system may contain a package structure as described above.

As observed in FIG. 5, the basic computing system may include a central processing unit 501 (which may include, e.g., a plurality of general purpose processing cores and a main memory controller disposed on an applications processor or multi-core processor), system memory 502, a display 503 (e.g., touchscreen, flat-panel), a local wired point-to-point link (e.g., USB) interface 04, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_N (e.g., one or more of a gyroscope, an accelerometer, a magnetometer, a temperature sensor, a pressure sensor, a humidity sensor, etc.), a camera 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing units 516 typically execute graphics intensive functions to, e.g., generate graphics information that is presented on the display 503. The memory control function 517 interfaces with the system memory 502. The system memory 502 may be a multi-level system memory.

Each of the touchscreen display 503, the communication interfaces 504-507, the GPS interface 508, the sensors 509, the camera 510, and the speaker/microphone codec 513, 514 all can be viewed as various forms of I/O (input and/or output) relative to the overall computing system including, where appropriate, an integrated peripheral device as well (e.g., the camera 510). Depending on implementation, various ones of these I/O components may be integrated on the applications processor/multi-core processor 550 or may be located off the die or outside the package of the applications processor/multi-core processor 550.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

An apparatus has been described having a redistribution layer, a semiconductor die on the redistribution layer, an electrically conductive layer over the semiconductor die and a compound mold over the electrically conductive layer. In an embodiment, the electrically conductive layer is comprised of a metal. In another embodiment, the electrically conductive layer is comprised of a metal foil. In yet another embodiment, the electrically conductive layer forms a contact to one or both of the semiconductor die and the redistribution layer. In an embodiment, the electrically conductive layer forms a heat spreader. In an embodiment, the electrically conductive layer forms an EMI shield. In yet another embodiment the apparatus further comprises a conductive via that extends from the electrically conductive layer through the compound mold to a top side metallization layer. In yet another embodiment, the conductive via is over the semiconductor die. In still yet another embodiment, the conductive via is not over the semiconductor die but is over the redistribution layer.

A computing system having the apparatus described and its various embodiments has also been described.

A method has been described that includes affixing multiple die to a carrier wafer, forming a layer of conductive material over the multiple die, forming a compound mold over the layer of conductive material, removing the carrier wafer, building a redistribution layer on respective sides of the die opposite the layer of conductive material and singulating the multiple die into separate at least partially packaged structures. In an embodiment, the method further includes patterning the layer of conductive material. In another embodiment, the method further includes etching the compound mold to expose regions of the layer of conductive material. In an embodiment, the method further includes filling a void created by the etching to form a contact structure. This embodiment may further includes forming a top side metallization layer over the compound mold, the contact structure being in electrical contact with the top side metallization structure.

The invention claimed is:

1. An apparatus, comprising:
   a redistribution layer;
   a semiconductor die on the redistribution layer, the semiconductor die having a contact structure on a side of the semiconductor die opposite the redistribution layer;
   an electrically conductive layer over the semiconductor die, the electrically conductive layer in direct electrical contact with the contact structure of the semiconductor die, and the electrically conductive layer in direct electrical contact with the redistribution layer, the electrically conductive layer coupling the contact structure of the semiconductor die to the redistribution layer; and,
   a compound mold over the electrically conductive layer.

2. The apparatus of claim 1 wherein the electrically conductive layer is comprised of a metal.

3. The apparatus of claim 2 wherein the electrically conductive layer is comprised of a metal foil.

4. The apparatus of claim 1 wherein the electrically conductive layer forms a heat spreader.

5. The apparatus of claim 1 wherein the electrically conductive layer forms an EMI shield.

6. The apparatus of claim 1 further comprising a conductive via that extends from the electrically conductive layer through the compound mold to a top side metallization layer.

7. The apparatus of claim 6 wherein the conductive via is over the semiconductor die.

8. The apparatus of claim 6 wherein the conductive via is not over the semiconductor die but is over the redistribution layer.

9. A computing system comprising a packaged die structure, the packaged die structure comprising:
   a redistribution layer;
   a semiconductor die on the redistribution layer, the semiconductor die having a contact structure on a side of the semiconductor die opposite the redistribution layer;
   an electrically conductive layer over the semiconductor die, the electrically conductive layer in direct electrical contact with the contact structure of the semiconductor die, and the electrically conductive layer in direct electrical contact with the redistribution layer, the electrically conductive layer coupling the contact structure of the semiconductor die to the redistribution layer; and, a compound mold over the electrically conductive layer.

10. The computing system of claim 9 wherein the electrically conductive layer is comprised of a metal foil.

11. The computing system of claim 9 wherein the electrically conductive layer forms a heat spreader.

12. The computing system of claim 9 wherein the electrically conductive layer forms an EMI shield.

13. The computing system of claim 9 further comprising a conductive via that extends from the electrically conductive layer through the compound mold to a top side metallization layer.

14. A method, comprising:

affixing multiple die to a carrier wafer, each of the multiple die having a contact structure on a side of the semiconductor die opposite the carrier wafer;

forming a layer of conductive material over the multiple die, the layer of conductive material in direct electrical contact with the contact structure of each of the multiple die;

forming a compound mold over the layer of conductive material;

removing the carrier wafer;

building a redistribution layer on respective sides of the die opposite the layer of conductive material, the redistribution layer in direct electrical contact with the layer of conductive material, the layer of conductive material coupling the contact structure of each of the multiple die to the redistribution layer;

singulating the multiple die into separate at least partially packaged structures.

15. The method of claim 14 further comprising patterning the layer of conductive material.

16. The method of claim 14 further comprising etching the compound mold to expose regions of the layer of conductive material.

17. The method of claim 14 further comprising filling a void created by the etching to form a contact via.

18. The method of claim 17 further comprising forming a top side metallization layer over the compound mold, the contact structure being in electrical contact with the top side metallization structure.

* * * * *